(12) United States Patent
Liao et al.

(10) Patent No.: US 11,101,349 B2
(45) Date of Patent: Aug. 24, 2021

(54) LATERAL POWER DEVICE WITH REDUCED ON-RESISTANCE

(71) Applicant: Efficient Power Conversion Corporation, El Segundo, CA (US)

(72) Inventors: Wen-Chia Liao, New Taipei (TW); Jianjun Cao, Torrance, CA (US); Fang Chang Liu, Hsinchu (TW); Muskan Sharma, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/555,564

(22) Filed: Aug. 29, 2019

(65) Prior Publication Data
US 2020/0075726 A1 Mar. 5, 2020

Related U.S. Application Data

(60) Provisional application No. 62/724,106, filed on Aug. 29, 2018.

(51) Int. Cl.
| | | |
|---|---|---|
| *H01L 29/08* | (2006.01) | |
| *H01L 29/06* | (2006.01) | |
| *H01L 29/78* | (2006.01) | |
| *H01L 29/66* | (2006.01) | |
| *H01L 29/423* | (2006.01) | |

(52) U.S. Cl.
CPC ...... *H01L 29/0847* (2013.01); *H01L 29/0634* (2013.01); *H01L 29/66659* (2013.01); *H01L 29/7835* (2013.01); *H01L 29/42368* (2013.01)

(58) Field of Classification Search
CPC ............. H01L 29/0847; H01L 29/0634; H01L 29/7835; H01L 29/66659; H01L 29/42368; H01L 24/10; H01L 29/1066; H01L 29/2003; H01L 29/7786
See application file for complete search history.

(56) References Cited

U.S. PATENT DOCUMENTS

| | | | | |
|---|---|---|---|---|
| 6,683,380 B2 * | 1/2004 | Efland | ..................... | H01L 24/48 257/734 |
| 6,972,464 B2 * | 12/2005 | Shen | ..................... | H01L 23/522 257/342 |
| 8,446,005 B2 * | 5/2013 | Yokouchi | ................ | H01L 24/05 257/734 |
| 9,324,819 B1 | 4/2016 | Lin et al. | | |

(Continued)

*Primary Examiner* — Yasser A Abdelaziez
(74) *Attorney, Agent, or Firm* — Blank Rome LLP

(57) ABSTRACT

A lateral power semiconductor device with a metal interconnect layout for low on-resistance. The metal interconnect layout includes first, second, and third metal layers, each of which include source bars and drain bars. Source bars in the first, second, and third metal layers are electrically connected. Drain bars in the first, second, and third metal layers are electrically connected. In one embodiment, the first and second metal layers are parallel, and the third metal layer is perpendicular to the first and second metal layers. In another embodiment, the first and third metal layer are parallel, and the second metal layer is perpendicular to the first and third metal layers. A nonconductive layer ensures solder bumps electrically connect to only source bars or only drain bars. As a result, a plurality of available pathways exists and enables current to take any of the plurality of available pathways.

9 Claims, 14 Drawing Sheets

(56) References Cited

U.S. PATENT DOCUMENTS

| | | |
|---|---|---|
| 9,972,571 B1 | 5/2018 | Chen et al. |
| 2002/0011674 A1* | 1/2002 | Efland ................ H01L 23/4952 |
| | | 257/762 |
| 2003/0011045 A1 | 1/2003 | Kleel et al. |
| 2009/0032942 A1 | 2/2009 | Choi |
| 2012/0221759 A1* | 8/2012 | Yokouchi ............ H01L 23/4824 |
| | | 710/306 |
| 2012/0313147 A1* | 12/2012 | Anderson ......... H01L 21/28518 |
| | | 257/204 |
| 2014/0159118 A1* | 6/2014 | Lenci ................ H01L 23/4824 |
| | | 257/194 |
| 2015/0069404 A1 | 3/2015 | Lin et al. |
| 2015/0243657 A1* | 8/2015 | Lin .................. H01L 23/49537 |
| | | 257/401 |
| 2016/0149031 A1* | 5/2016 | Jung ................ H01L 29/66681 |
| | | 257/343 |
| 2017/1548390 | 6/2017 | Lin et al. |
| 2018/0026126 A1* | 1/2018 | Ramdani ............ H01L 21/0217 |
| | | 257/76 |

* cited by examiner

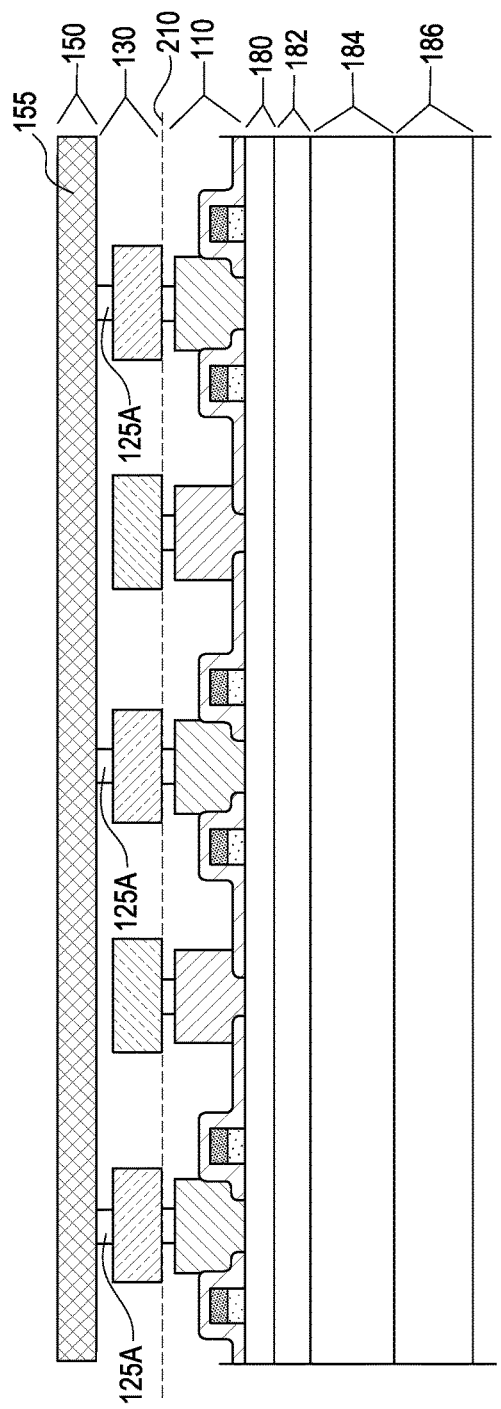
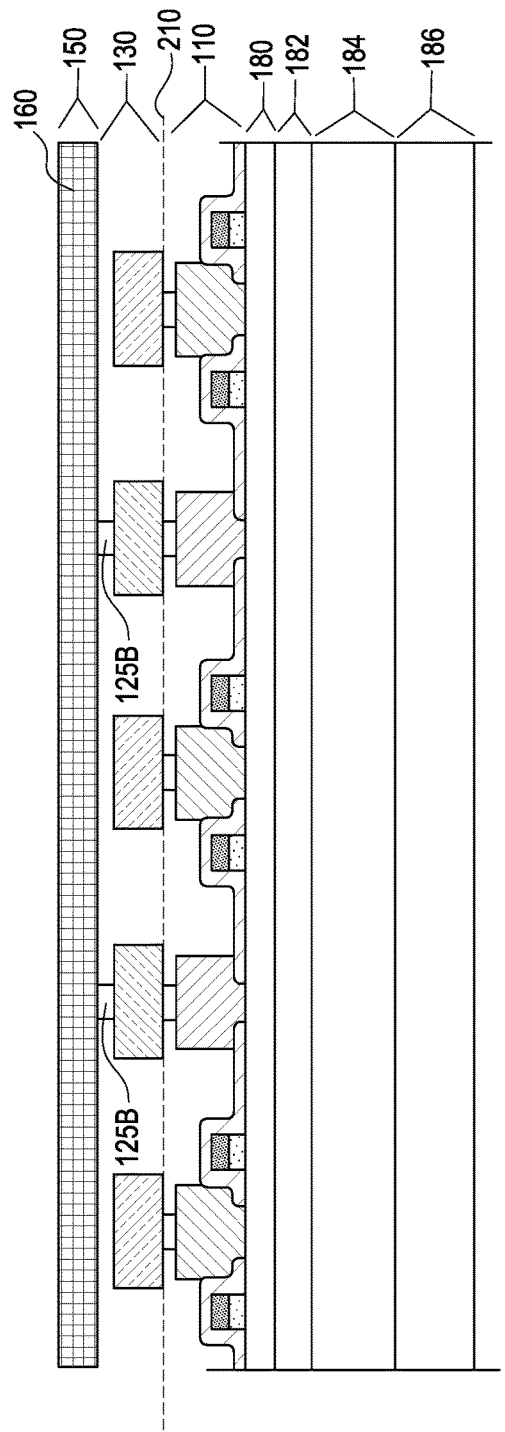
FIG. 2E
FIG. 2F

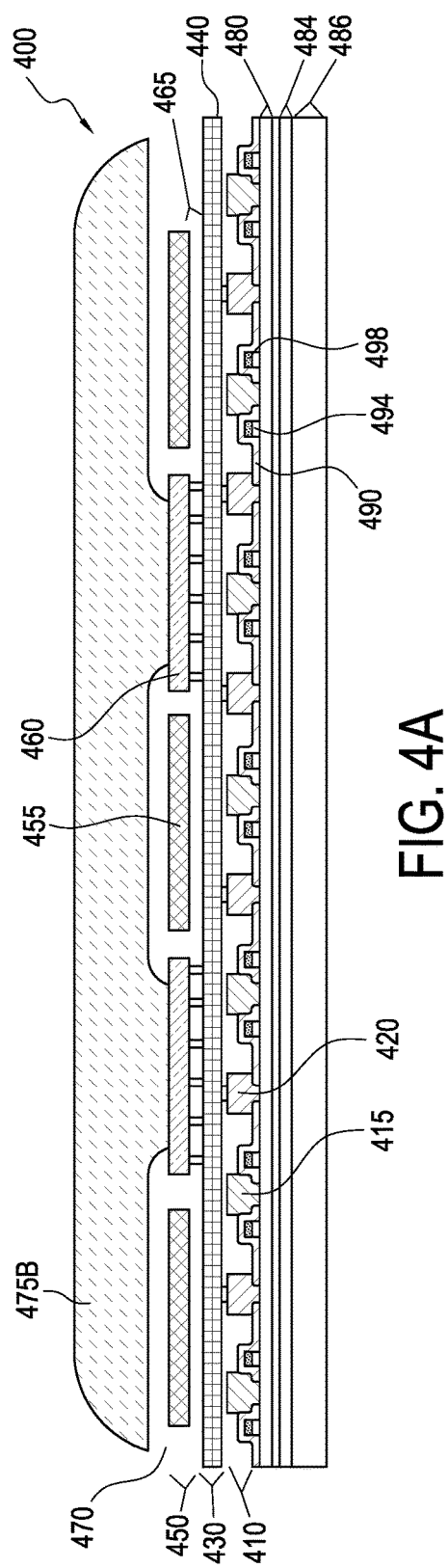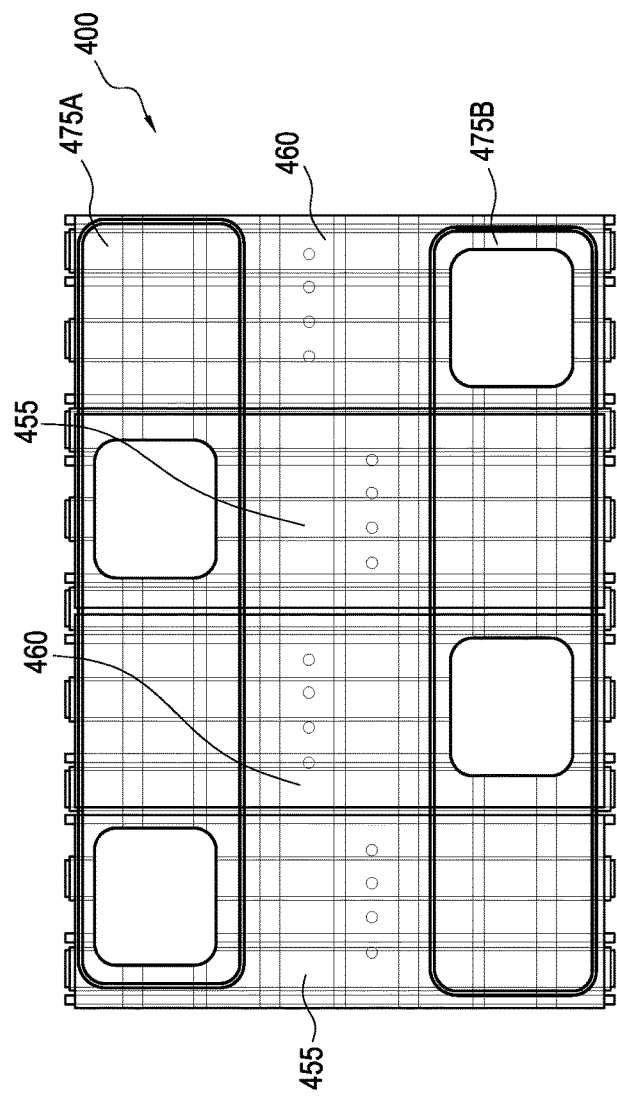

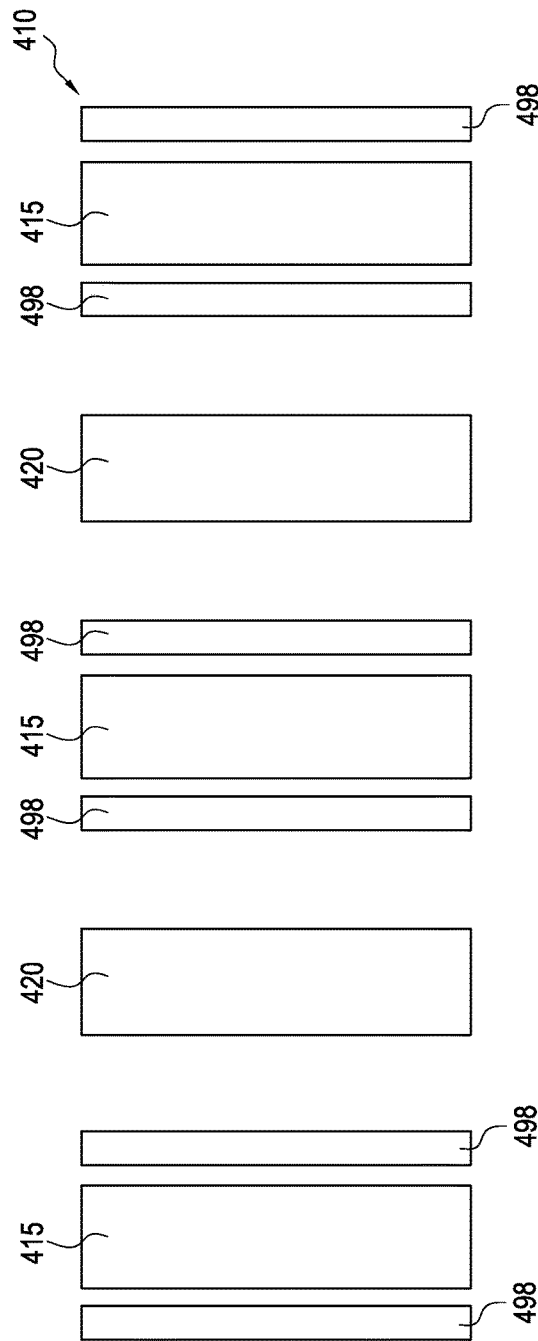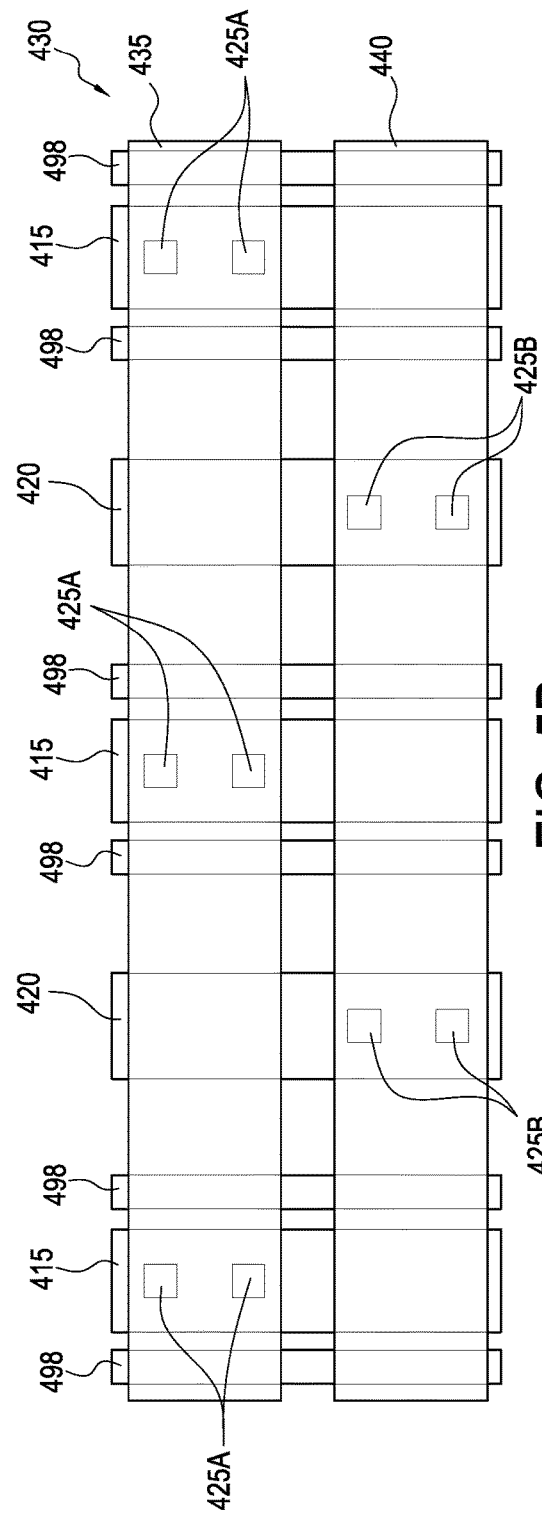
FIG. 5A
FIG. 5B

LATERAL POWER DEVICE WITH REDUCED ON-RESISTANCE

CROSS-REFERENCE TO RELATED APPLICATIONS

This application claims the benefit of U.S. Provisional Application No. 62/724,106, filed on Aug. 29, 2018, the entire disclosure of which is hereby incorporated by reference.

BACKGROUND

1. Field of the Invention

The present invention relates generally to the field of semiconductor devices, specifically gallium nitride (GaN) power semiconductor devices, and methods of interconnection of such devices.

2. Description of the Related Art

Conventional lateral power field effect transistors (FETs) include long, thin metal interconnects used to connect transistor cells and external leads of the semiconductor device. However, these interconnects increase the parasitic resistance of the semiconductor device and the on-resistance of the device. As the die size of the FET is increased and larger numbers of transistor cells are connected in parallel to withstand greater power, the parasitic resistance due to these interconnects and, by extension, the on-resistance of the device, is also increased. Accordingly, there is a need to provide lateral power devices with interconnects having reduced parasitic resistance to reduce on-resistance.

SUMMARY OF THE INVENTION

The present invention addresses the disadvantages of conventional metal interconnects in lateral power FETs, discussed above, by providing a metal interconnect layout with a plurality of available current pathways and decreased parasitic resistance and decreased on-resistance for lateral power devices such as GaN FET semiconductor devices.

The present invention, as described herein, comprises a first metal layer of source metal bars and drain metal bars, a second metal layer of source metal bars and drain metal bars, and a third metal layer of source metal bars and drain metal bars. Source metal bars in the first, second, and third metal layers are electrically connected. Drain metal bars in the first, second, and third metal layers are electrically connected. In one embodiment, the first and the second metal layers are substantially in parallel, and the third metal layer is substantially perpendicular to the first and the second metal layers. In another embodiment, the first and the third metal layer are substantially parallel, and the second metal layer is substantially perpendicular to the first and the third metal layers. A nonconductive layer ensures solder bumps electrically connect to only one of source metal bars or drain metal bars. As a result, a plurality of available pathways exists and enables current to take any of the plurality of available pathways.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIGS. 2A-I illustrate a process for forming the transistor device shown in FIGS. 1A-C.

FIGS. 4A-C illustrate a GaN transistor device according to a second embodiment of the present invention.

FIGS. 5A-D illustrate a layout of metal interconnects within the transistor device shown in FIGS. 4A-C.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

While embodiments described herein include GaN semiconductor devices, it should be understood that the invention is not limited to GaN semiconductor devices. For example, the described embodiments may be applicable to semiconductor devices and other devices that use different conductive materials, such as silicon (Si) or silicon carbide (SiC) semiconductor devices and germanium (Ge) material semiconductor devices.

In addition, while implanted or diffused conductive regions or layers are described, it should be understood that these are examples of regions of different polarity within a substrate. Thus, while the described embodiments may refer to a particular method of fabricating opposite polarity regions, it should be understood that other types of opposite-polarity regions and methods of fabrication thereof may be used.

Described embodiments include a transistor or other semiconductor device, such as a GaN transistor or an integrated circuit including transistors, which has a conductive substrate, where regions of the substrate are doped with an oppositely-polarized conductivity to that of the substrate. The regions of opposite polarity may be, for example, an n-type material in a p-type substrate. The device has an electrical connection, such as through a via, from a contact at its front side to the regions of opposite polarity. In other embodiments, the regions may have the same doping type as the substrate, and may be surrounded by one or more insulating layers. In other embodiments, the substrate may be substantially non-conductive, while the regions have either a p-type or n-type doping. In other embodiments, silicon-on-insulator (SOI) embodiments, and embodiments including parallel conducting channels, are also described.

Figure 1A:
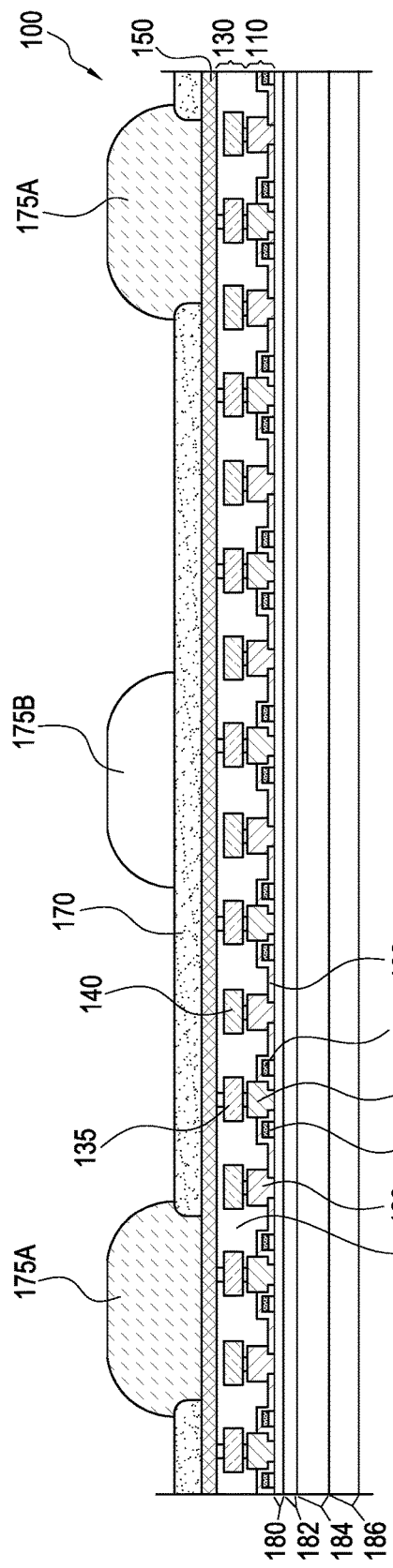
FIGS. 1A-C illustrate a GaN transistor device according to a first embodiment of the present invention.
Figure 1B:
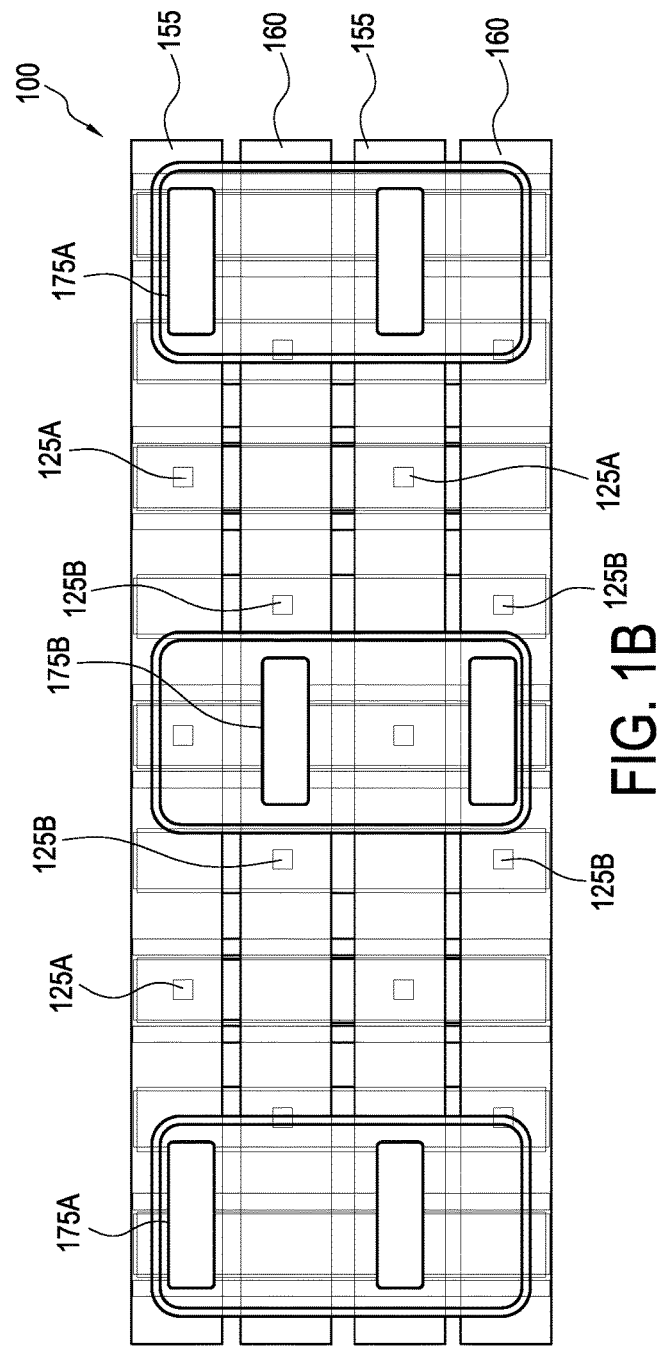
Figure 1C:
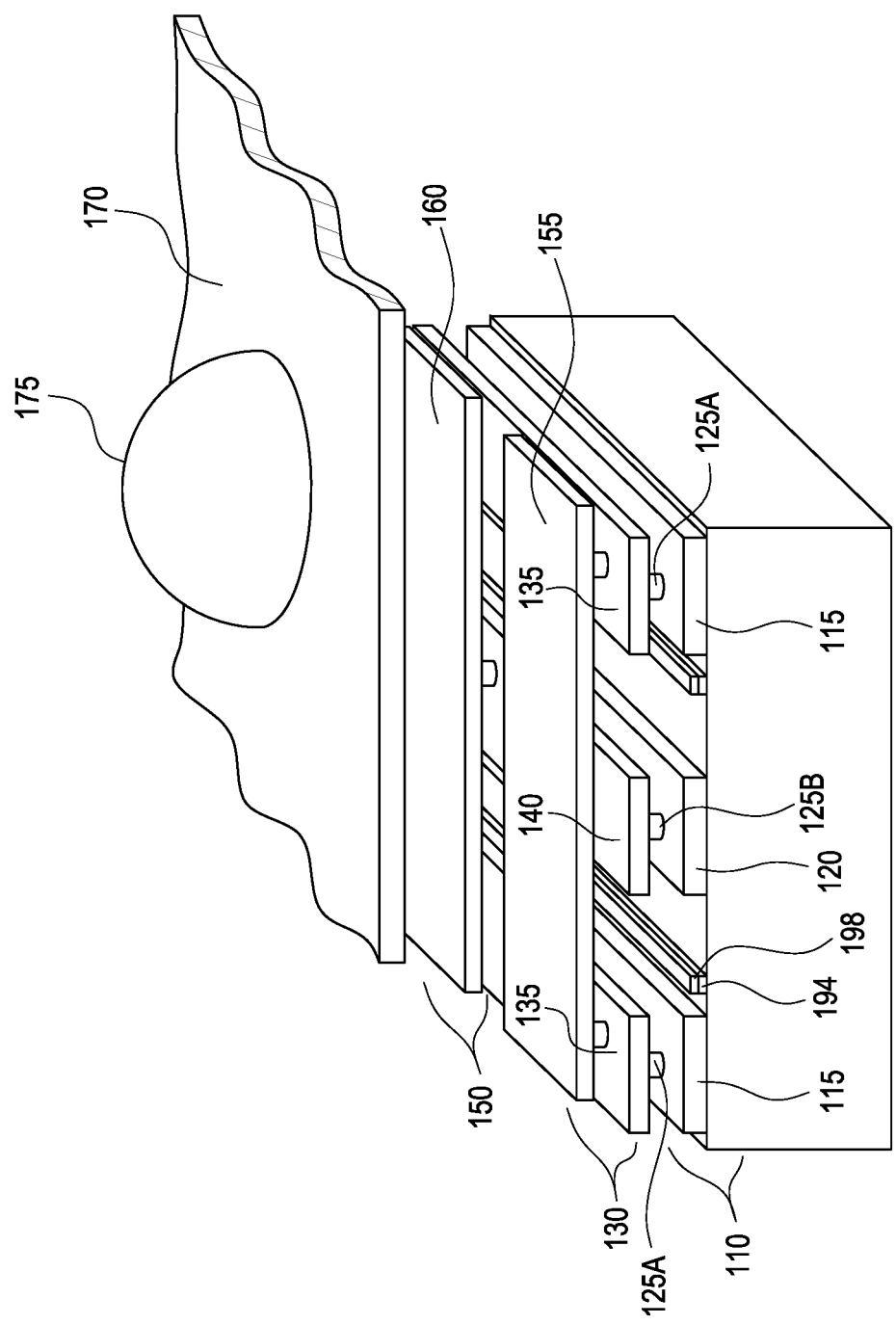

FIGS. 1A-C illustrate a GaN transistor device 100 according to a first embodiment of the present invention. FIG. 1A illustrates a cross-sectional view of GaN transistor device 100, which includes a substrate 186 composed of one or more Si, SiC, GaN, gallium arsenide (GaAs), aluminum-nitride (AlN), and/or sapphire-based materials. A buffer layer 184 is formed over substrate 186 and may be composed of one or more layers of compound semiconductor materials (e.g., AlN material). A channel layer 182 is formed over buffer 184 and may be composed of one or more layers of GaN having a thickness between 0.05 to 5 micrometers (μm). In some implementations, channel layer 182 is composed of indium gallium nitride (InGaN) or other suitable materials with sufficient electron density and electron mobility to promote current flow through the channel layer 182. A barrier layer 180 is formed over channel layer 182 and may be composed of aluminum gallium nitride (AlGaN) having a thickness of 0.005 to 0.03 μm with 12-28% Al.

Gate layer 194 is selectively formed in parallel lines directly over barrier layer 180 and may be composed of a III-V compound having a thickness of 0.05 to 0.2 μm. In some implementations, gate layer 194 can be a p-type compound, such as GaN doped with magnesium (Mg). Gate electrodes 198 are formed directly over gate layer 194 and may be composed of a refractory metal or its compound, such as tantalum (Ta), tantalum nitride (TaN), titanium nitride (TiN), palladium (Pd), tungsten (W), tungsten silicide (WSi$_2$), or the like. Insulator 190 covers gate layer 194 and gate electrodes 198 to insulate them and barrier layer 180 from components above them.

A first metal layer 110 includes source metal bars 115 and drain metal bars 120 selectively formed in substantially parallel lines over barrier layer 180 between gate electrodes 198, which may be composed of aluminum copper (AlCu). A second metal layer 130 includes source metal bars 135 selectively formed substantially in parallel over source metal bars 115 in first metal layer 110. Source metal bars 135 and 115 are electrically connected by vias 125A, shown more clearly in FIG. 2C. Second metal layer 130 also includes drain metal bars 140 selectively formed substantially in parallel over drain metal bars 120 in first metal layer 110. Drain metal bars 140 and 120 are electrically connected by vias 125B, shown more clearly in FIG. 2C. Metal bars 135 and 140 in second metal layer 130 may be composed of AlCu.

A third metal layer 150 includes source metal bars 155 and drain metal bars 160, which may be composed of AlCu. FIG. 1A illustrates a source metal bar 155 selectively formed substantially perpendicular to first metal layer 110 and second metal layer 130. Source metal bars 155 and 135 are electrically connected by vias 125A, shown more clearly in FIG. 2E. Vias 125A may be spaced such that source metal bars 155 are not electrically connected to drain metal bars 140 in second metal layer 130.

Referring now to FIG. 1B which shows a top plan view of device 100, third metal layer 150 also includes drain metal bars 160 selectively formed substantially perpendicular to first metal layer 110 and second metal layer 130, and substantially parallel to source metal bars 155. Drain metal bars 160 and 140 are electrically connected by vias 125B, shown more clearly in FIG. 2F. Vias 125B may be spaced such that drain metal bars 160 are not electrically connected to source metal bars 135 in second metal layer 130. Vias 125A-B are discussed further with reference to FIGS. 2E-F.

Returning to FIG. 1A, the space between the source metal bars 115, 135, and 155 and drain metal bars 120, 140, and 160 is filled by a dielectric film 165, which may be composed of silicon nitride (Si$_3$N$_4$), silicon dioxide (SiO$_2$), or the like. A nonconductive layer 170 is selectively formed over third metal layer 150 and dielectric film 165, such that each solder bump 175 is electrically connected to only source metal bars 155 or only to drain metal bars 160, not both. Nonconductive layer 170 may be composed of one or more of Si$_3$N$_4$, SiO$_2$, polyimide, and the like. FIG. 1B illustrates that solder bump 175A is electrically connected to source metal bars 155, not to drain metal bars 160, and solder bump 175B is electrically connected to drain metal bars 160, not to source metal bars 155. Solder bumps 175A-B may be composed of under bump metal such as titanium (Ti) and/or copper (Cu) as well as tin silver alloys (SnAg), having a thickness between 50-400 μm.

FIG. 1C illustrates a perspective view of device 100. First metal layer 110 and second metal layer 130 are substantially parallel. Source metal bars 135 overlay source metal bars 115 and are electrically connected to source metal bars 115 by vias 125A. Drain metal bars 140 overlay drain metal bars 120 and are electrically connected to drain metal bars 120 by vias 125B. Third metal layer 150 is substantially perpendicular to first metal layer 110 and second metal layer 130. Source metal bars 155 are perpendicular to source metal bars 115 and 135 and are electrically connected to source metal bars 135 by vias 125A. Drain metal bars 160 are perpendicular to drain metal bars 120 and 140 and are electrically connected to drain metal bars 140 by vias 125B.

Nonconductive layer 170 is formed over third metal layer 150 and prevents solder bump 175A from electrically connecting to drain metal bars 160. Solder bump 175A electrically connects to two or more source metal bars 155 by directly contacting source metal bars 155 and may include under bump metal to ensure a good electrical connection. First metal layer 110, second metal layer 130, and third metal layer 150 create a plurality of available current pathways and reduce the on-resistance of device 100 by enabling current through device 100 to take any of the plurality of available current pathways. Further, nonconductive layer 170 ensures solder bumps 175 are electrically connected with only source metal bars 155 or only drain metal bars 160 and allows solder bumps 175 to act as conventional source and drain pads, reducing the metal resistance.

Figure 2A:
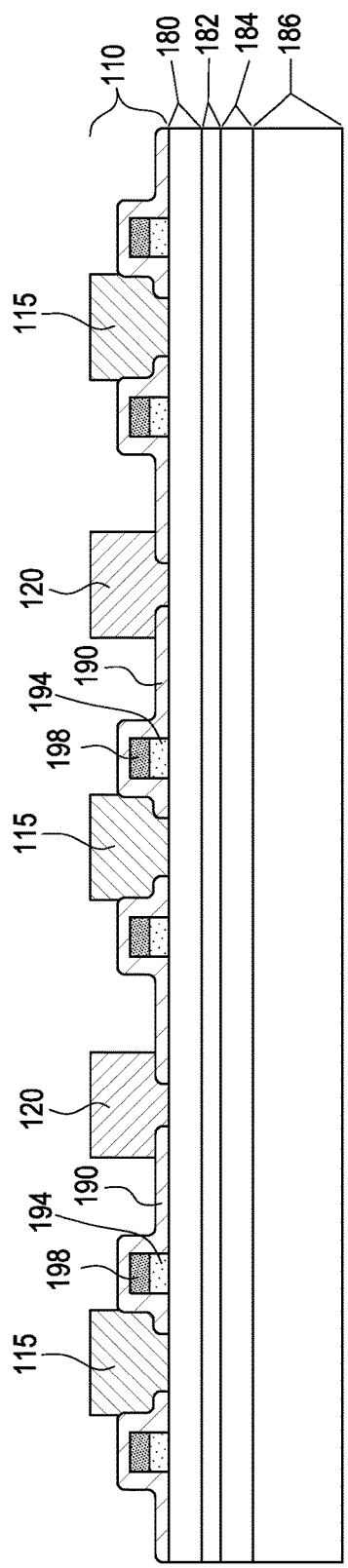

FIGS. 2A-H illustrate the layout of device 100 in more detail. In FIG. 2A, substrate 186 is provided, such as on a wafer substrate, and buffer layer 184, channel layer 182, and barrier layer 180 are layered on substrate 186. Channel layer 182 composed of InGaN or other suitable materials is layered over buffer layer 184 and has a thickness between 0.01 and 0.5 μm. Barrier layer 180 composed of AlGaN is layered over channel layer 182 and has a thickness between 0.005 and 0.03 μm. The AlGaN can be 12-28% Al.

Gate layer 194 forms substantially parallel lines on barrier layer 180 and has a thickness between 0.05 and 0.2 μm. Gate layer 194 may be composed of an Mg doped GaN material, for example. Gate electrodes 198 are layered over gate layer 194. In some embodiments, gate layer 194 and gate electrodes 198 each have a thickness between about 0.01 and about 1.0 μm. Insulator 190 selectively covers barrier layer 180, gate layer 194, and gate electrodes 198. Insulator 190 isolates gate layer 194 and gate electrodes 198 from other components above them on device 100, and covers selective portions of barrier layer 180 while leaving openings 205 for source metal bars 115 and opening 210 for drain metal bars 120 to be formed directly over barrier layer 180.

Figure 2B:
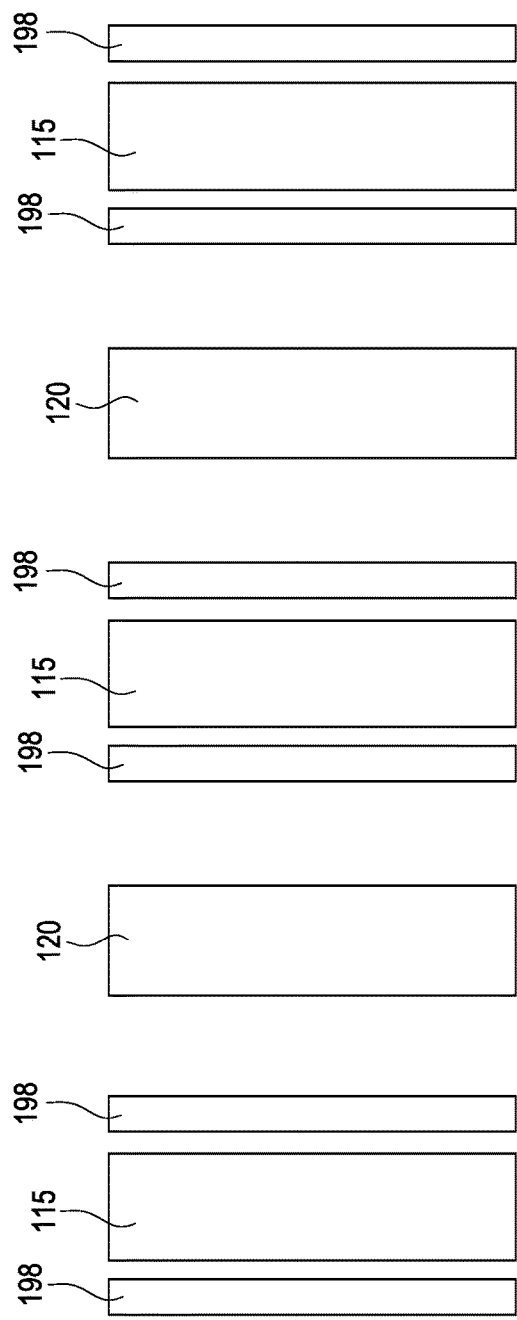

First metal layer 110 forms substantially parallel lines across barrier layer 180 between insulator 190 and gate electrodes 198 in the openings 205. The space between source metal bars 115 and gate electrodes 198 is smaller than the space between drain metal bars 120 and gate electrodes 198. Metal layer 110 may comprise a titanium aluminum alloy. FIG. 2B illustrates the parallel lines of gate electrodes 198, metal bars 115 and 120, and the relative spacing between each.

Figure 2C:
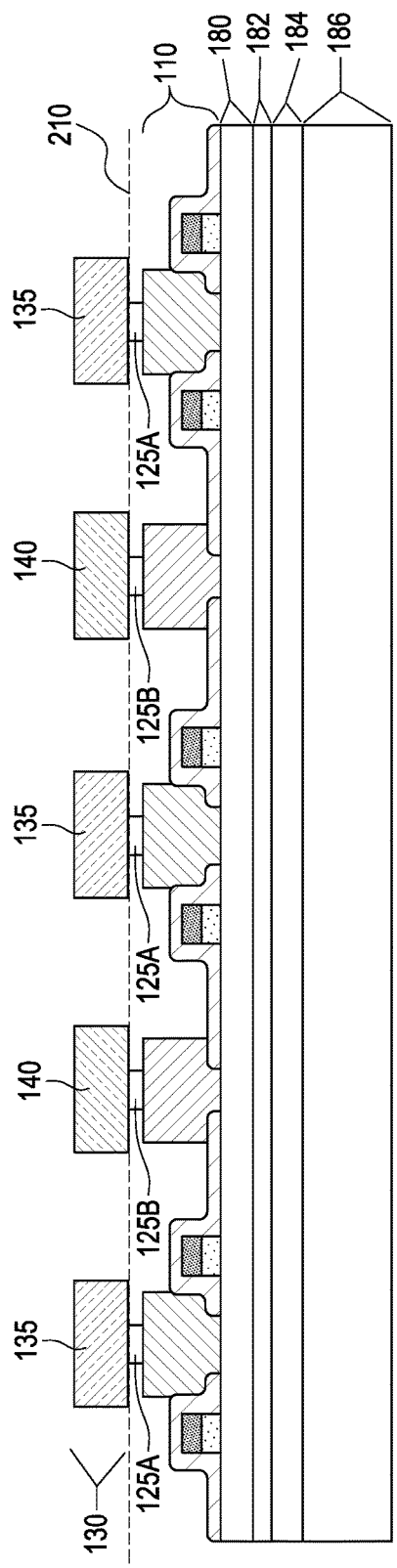
Figure 2D:
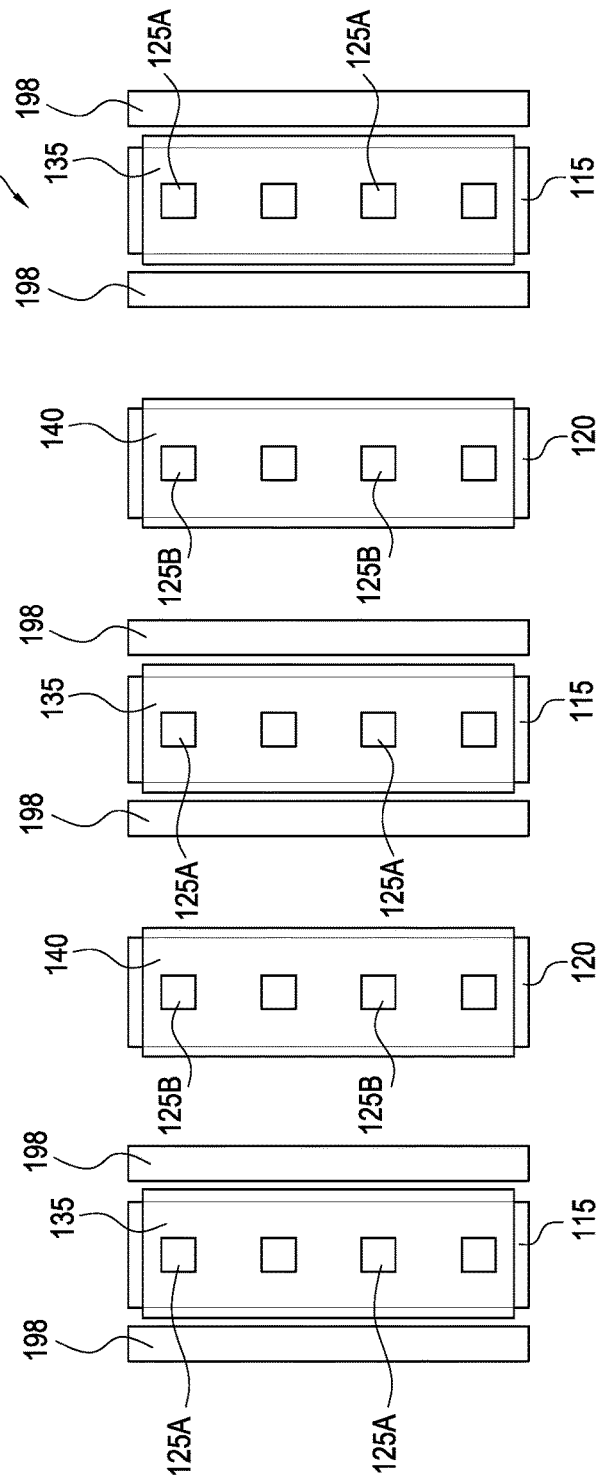

As shown in FIG. 2C, second metal layer 130 forms substantially parallel lines over metal layer 110. Source metal bars 135 are layered over source metal bars 115 and electrically connected by vias 125A. Drain metal bars 140 are layered over drain metal bars 120 and electrically connected by vias 125B. Line 210 illustrates the demarcation between first metal layer 110 and second metal layer 130. FIG. 2D illustrates the overlay of second metal layer 130 and first metal layer 110, as well as vias 125A electrically connecting source metal bars 115 and 135 and vias 125B electrically connecting drain metal bars 120 and 140.

Figure 2G:
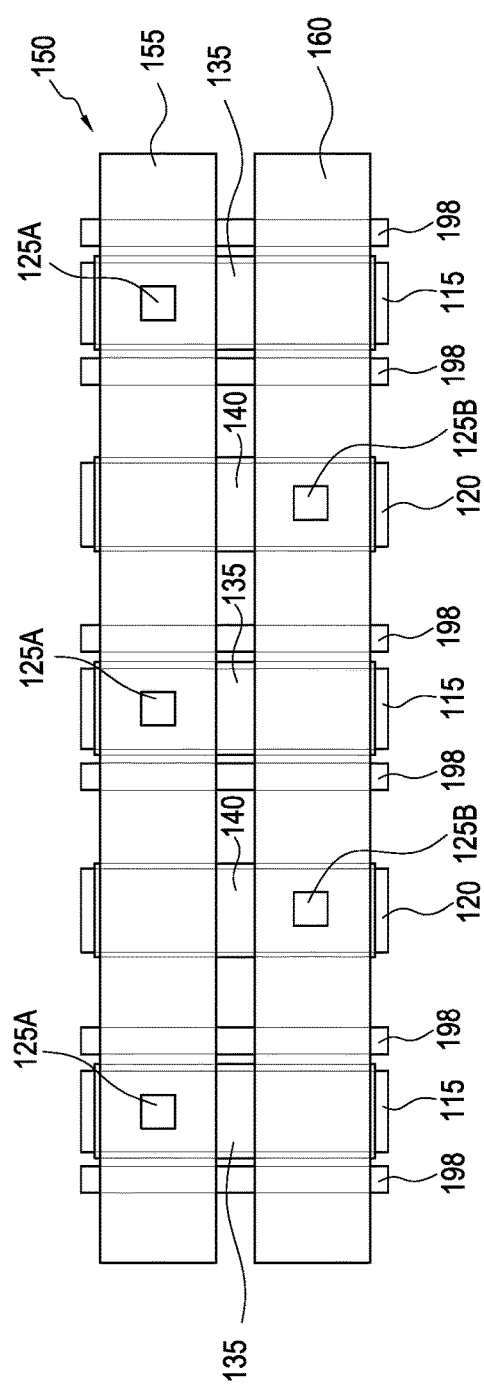

As shown in FIG. 2E, third metal layer 150 forms substantially perpendicular lines over second metal layer 130. FIG. 2E illustrates a source metal bar 155 layered over both source metal bars 135 and drain metal bars 140, and electrically connected to source metal bars 135 by vias 125A. FIG. 2F illustrates a drain metal bar 160 layered over both source metal bars 135 and drain metal bars 140, and electrically connected to drain metal bars 140 by vias 125B. The empty space between metal layers 110, 130, and 150 may be filled by dielectric film 165, as may be seen in both FIGS. 2E and 2F. FIG. 2G illustrates the perpendicular overlay of third metal layer 150 over the parallel metal layers 110 and 130, as well as vias 125A spaced to electrically connect source metal bars 155 and 135 and vias 125B spaced to electrically connect drain metal bars 160 and 140.

Figure 2H:
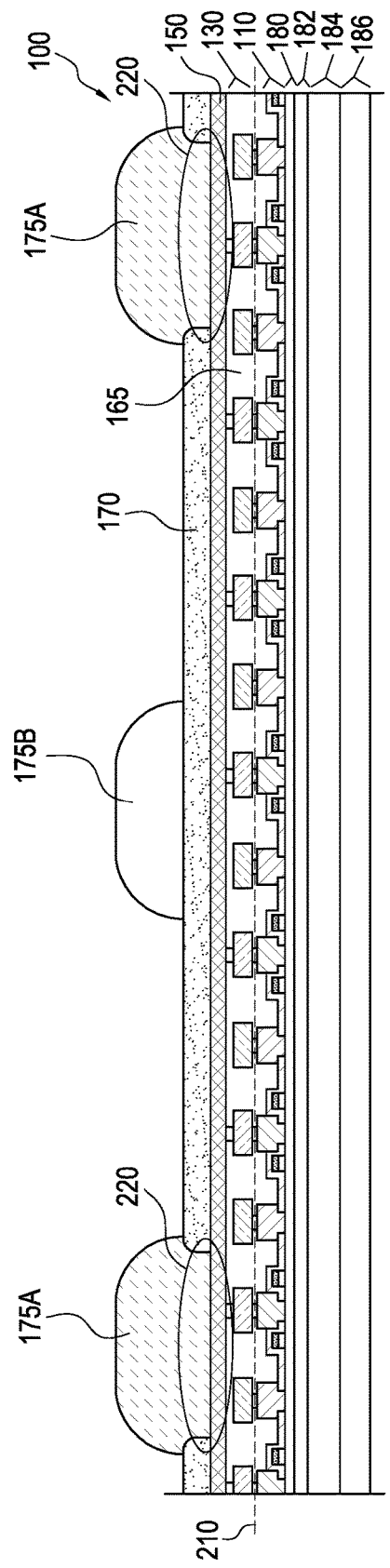
Figure 2I:
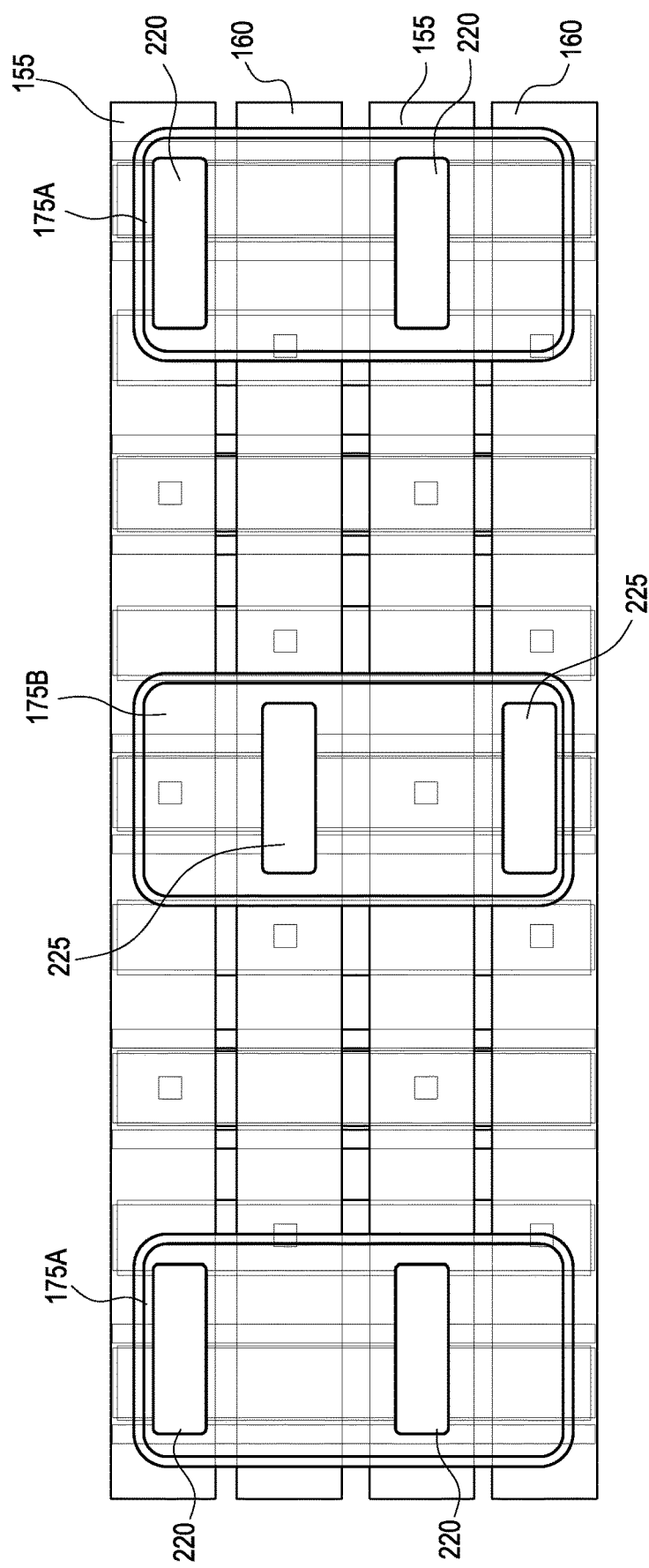

As shown in FIG. 2H, nonconductive layer 170 is selectively formed over metal layer 150 to leave openings 220 for solder bumps 175A to electrically connect to source metal bars 155 and openings 225, not shown, for solder bumps 175B to electrically connect to drain metal bars 160. Solder bumps 175 are formed over the openings 220 and 225 to electrically connect two or more source metal bars 155 or two or more drain metal bars 160, respectively. Solder bumps 175A are directly touching source metal bars 155, while solder bump 175B is isolated from source metal bars 155. FIG. 2I illustrates a top plan view of solder bumps 175 over third metal layer 150, as well as openings 220 for solder bumps 175A to electrically connect to source metal bars 155 and openings 225 for solder bump 175B to electrically connect to drain metal bars 160.

Figure 3A:
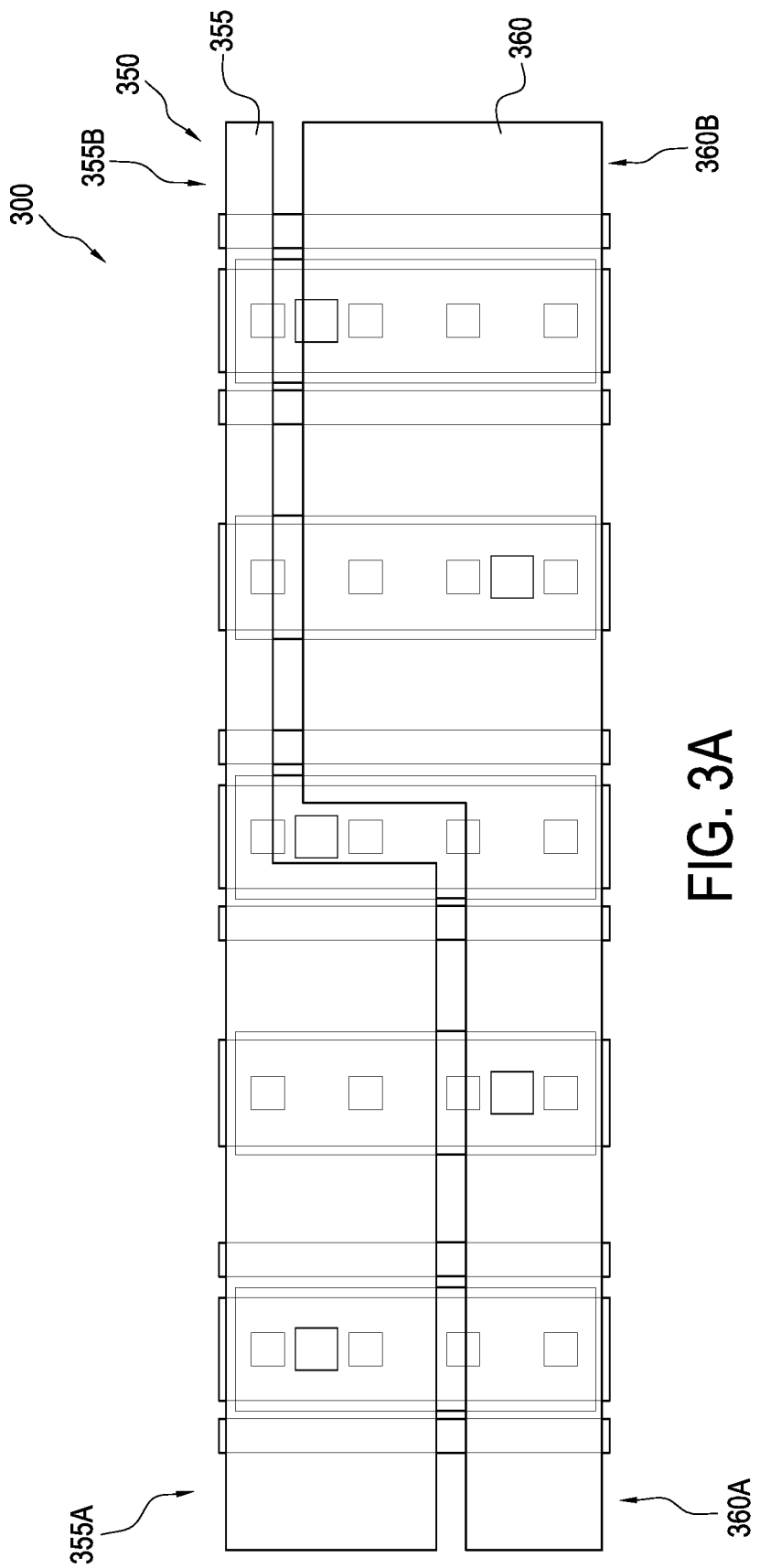
FIGS. 3A-B illustrate a GaN transistor device according to the first embodiment of the present invention.
Figure 3B:
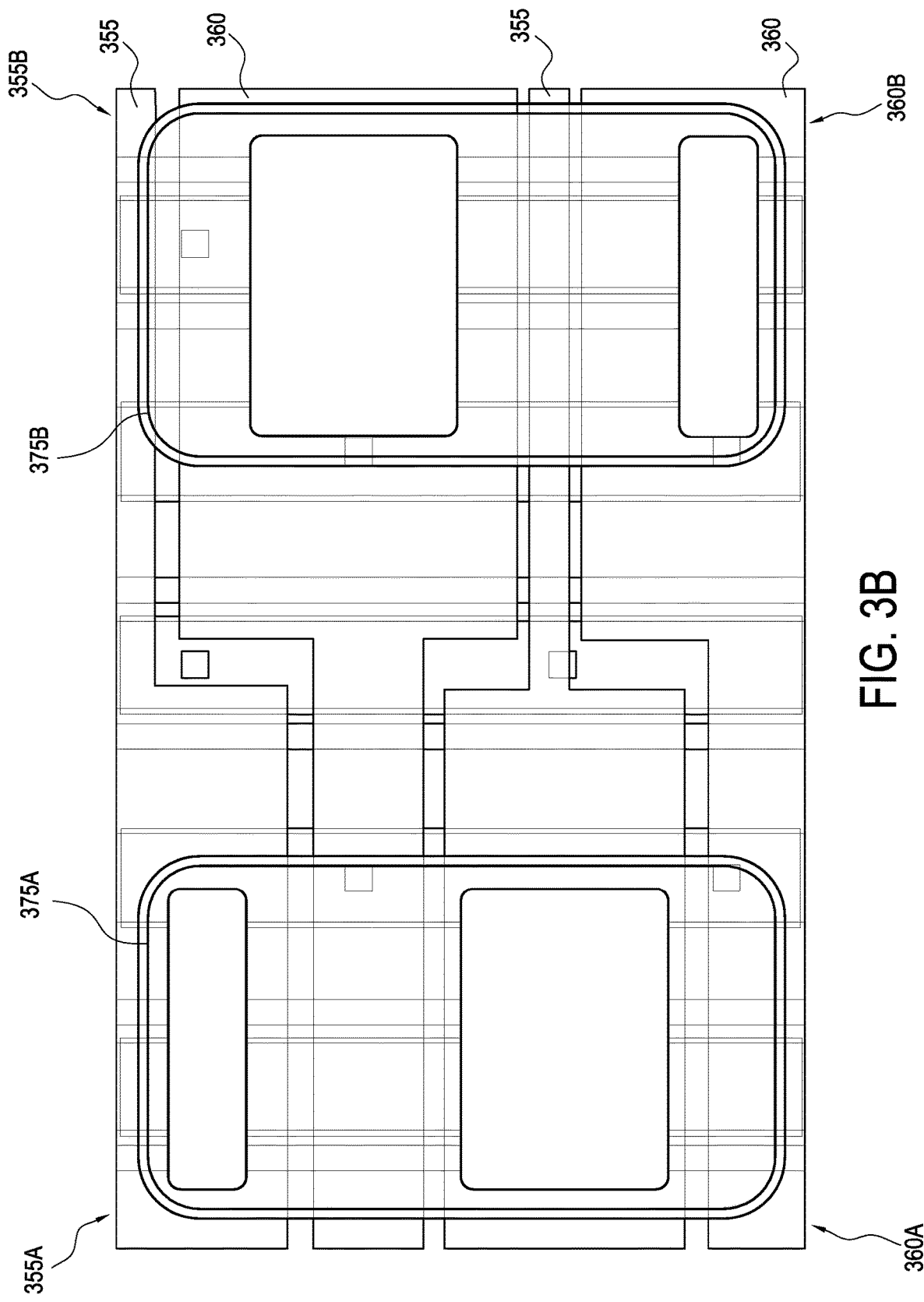

FIGS. 3A-B illustrate a GaN transistor device 300 according to a variation of the first embodiment of the present invention. Device 300 is similar to device 100 shown in FIGS. 1A-C, but metal bars 355 and 360 in third metal layer 350 are not a constant width. FIG. 3A illustrates a top plan view showing the overlay of third metal layer 350 over metal layers 310 and 330. Source metal bar 355 is wider in section 355A and narrower in section 355B. Inversely, drain metal bar 360 is narrower in section 360A and wider in section 360B. The offset wider sections of source metal bar 355 and drain metal bar 360 can be interleaved while a threshold distance between edges of source metal bar 355 and edges of drain metal bar 360 is maintained. In some implementations, the threshold distance between an edge of source metal bar 355 and an edge of drain metal bar 360 is 2 µm.

FIG. 3B illustrates a top plan view of device 300. Solder bumps 375 overlay the interleaved wider sections of metal bars 355 and 360. Solder bump 375A overlays the wider section 355A of source metal bars 355, and solder bump 375B overlays the wider section 360B of drain metal bars 360. The increased width of section 355A of source metal bar 355 and section 360B of drain metal bar 360 increases the contact area for solder bumping and enables better current spreading. In addition, the wider sections of metal bars 355 and 360 increase the distance between the contact area for bumping and the edges of metal bars 355 and 360, which enlarges the contact area for solder bumps 375 and reduces the current density and contact resistance for metal bars 355 and 360.

Figure 4C:
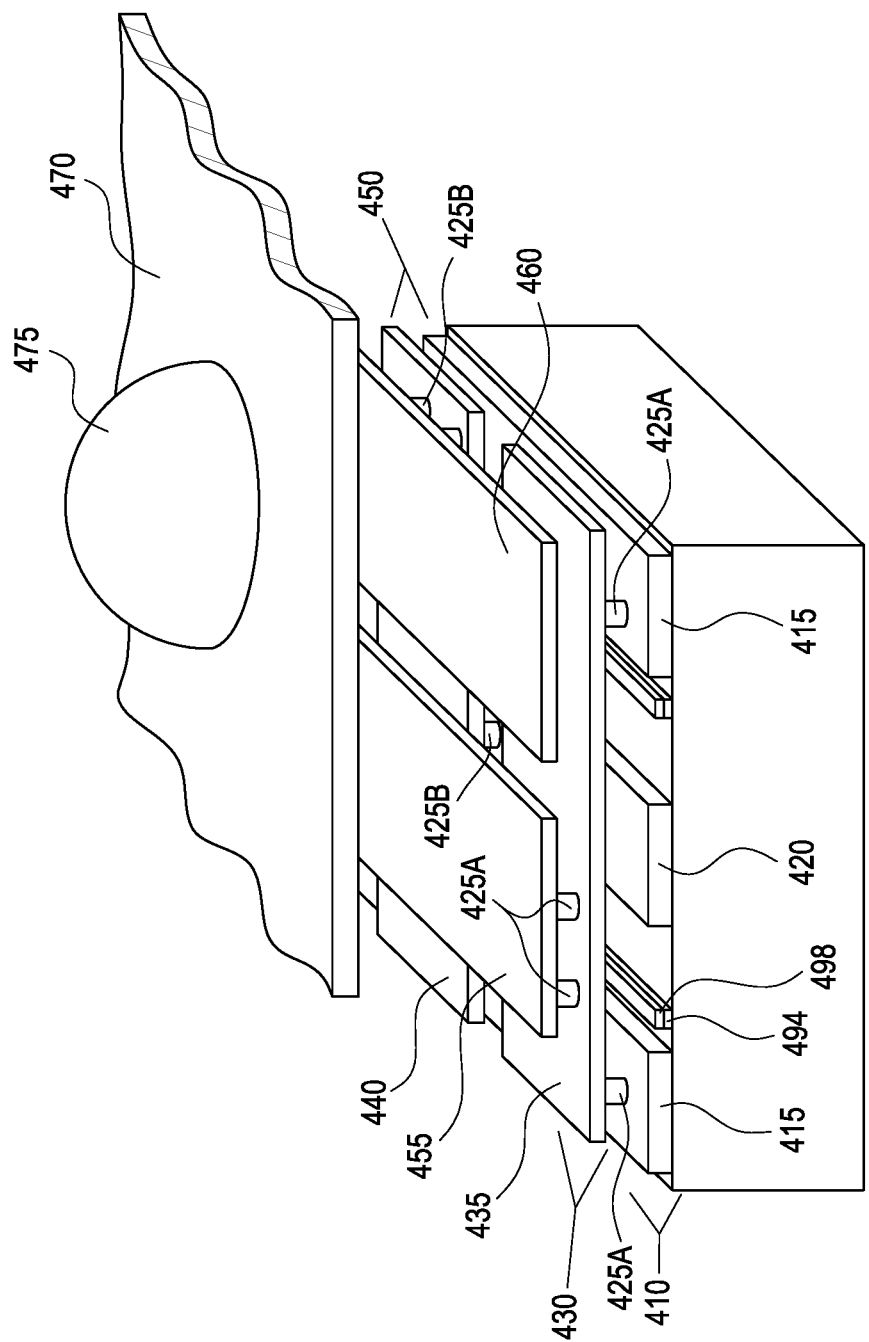

FIGS. 4A-C illustrate a GaN transistor device 400 according to a second embodiment of the present invention. Device 400 is similar to device 100 shown in FIGS. 1A-C, including similar parameters and a similar fabrication process, but implements a different layout of source metal bars and drain metal bars in a first, a second, and a third metal layer. FIG. 4A illustrates a cross-sectional view of GaN transistor device 400, which includes a substrate 486, a buffer layer 484, a channel layer 482, a barrier layer 480, a gate layer 494 and gate electrodes 498, and an insulator 490 similar to the corresponding components in device 100. A first metal layer 410 includes source metal bars 415 and drain metal bars 420 selectively formed in substantially parallel lines over barrier layer 480 between gate electrodes 498.

A second metal layer 430 includes source metal bars 435, not shown in FIG. 4A, and drain metal bars 440, one of which is shown in FIG. 4A. Source metal bars 435 and drain metal bars 440 are selectively formed substantially perpendicular to first metal layer 410. Drain metal bars 440 and 420 are electrically connected by vias 425B, shown more clearly in FIG. 5B. Vias 425B may be spaced such that drain metal bars 440 are not electrically connected to source metal bars 415. Source metal bars 435, not shown in the cross-sectional view of FIG. 4A, are electrically connected to source metal bars 415 by vias 425A. Vias 425A may be spaced such that source metal bars 435 are not electrically connected to drain metal bars 420 in first metal layer 410.

A third metal layer 450 includes source metal bars 455 and drain metal bars 460 selectively formed substantially in parallel with first metal layer 410 and substantially perpendicular to second metal layer 430. Source metal bars 455 are selectively formed substantially perpendicular to second metal layer 430 and electrically connected to source metal bars 435 by vias 425A. Vias 425A may be spaced such that source metal bars 455 are not electrically connected to drain metal bars 440. Drain metal bars 460 are selectively formed substantially perpendicular to second layer 430 and electrically connected to drain metal bars 440 by vias 425B, shown more clearly in FIG. 5C. Vias 425B may be spaced such that drain metal bars 460 are not electrically connected to source metal bars 435. A width of metal bars 455 and 460 in third metal layer 450 is greater than a width of metal bars 415 and 420 in first metal layer 410. A dielectric film 465 fills the empty space between metal layers 410, 430, and 450.

Device 400 also includes a nonconductive layer 470, and solder bumps 475 similar to the corresponding components in device 100. Referring now to FIG. 4B, which illustrates a top plan view of device 400, the width of metal bars 455 and 460 in third metal layer 450 is greater than the width of metal bars 415 and 420 in first metal layer 410, the width of metal bars 435 and 440 in second metal layer 430, and a width of metal bars 155 and 160 in first metal layer 110 of device 100 shown in FIGS. 1A-C. The increased width of metal bars 455 and 460 increases the contact area for bumping and enables better current spreading. In addition, the increased width of metal bars 455 and 460 increases the distance between the contact area for bumping and the edges of metal bars 455 and 460, which decreases on-chip stress induced by temperature variation.

FIG. 4C illustrates a perspective view of device 400. Second metal layer 430 is substantially perpendicular to first metal layer 410, and third metal layer 450 is substantially perpendicular to second metal layer 430 and substantially in parallel with first metal layer 410. Source metal bars 435 and 415 are electrically connected by vias 425A, and drain metal bars 440 and 420 are electrically connected by vias 425B. Source metal bars 455 and 435 are electrically connected by vias 425A, and drain metal bars 460 and 440 are electrically connected by vias 425B.

Nonconductive layer 470 is formed over third metal layer 450 and prevents solder bump 475A from electrically connecting to drain metal bars 460. Solder bump 475A electrically connects to source metal bars 455 by directly contacting source metal bars 455 and may include under bump metal to ensure a good electrical connection. First metal layer 410, second metal layer 430, and third metal layer 450 create a plurality of available current pathways and reduce the on-resistance of device 400 by enabling current through device 400 to take any of the plurality of available current pathways. Further, nonconductive layer 470 ensures solder bumps 475 are electrically connected with only source metal bars 455 or only drain metal bars 460 and allows solder bumps 475 to act as conventional source and drain pads, reducing the metal resistance.

Figure 5C:
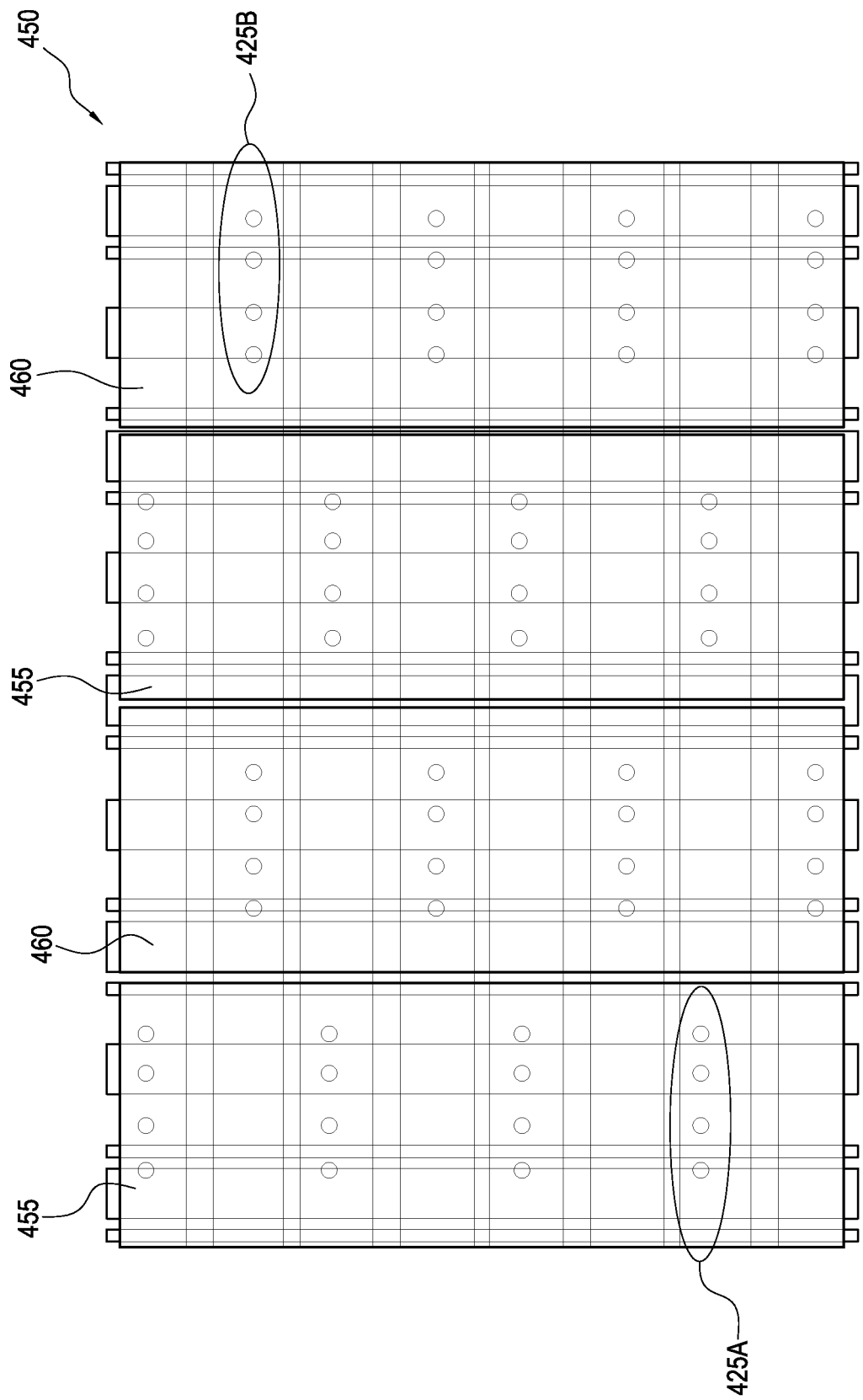

FIGS. 5A-D illustrate the layout of first metal layer 410, second metal layer 430, third metal layer 450, and solder bumps 475 in device 400 shown in FIGS. 4A-C. In FIG. 5A which illustrates a top plan view of first metal layer 410, metal bars 415 and 420 are substantially in parallel with, and between, gate electrodes 498. The space between source metal bars 415 and gate electrodes 498 is smaller than the space between drain metal bars 420 and gate electrodes 498. FIG. 5B illustrates a top plan view of second metal layer 430 overlaid substantially perpendicular to first metal layer 410. A source metal bar 435 overlays both source metal bars 415 and drain metal bars 420 and is electrically connected to source metal bars 415 by vias 425A. A drain metal bar 440 overlays both source metal bars 415 and drain metal bars 420 and is electrically connected to drain metal bars 425 by vias 425B. A width of metal bars 435 and 440 may be greater than a width of metal bars 415 and 420.

FIG. 5C illustrates a top plan view of third metal layer 450 overlaid substantially perpendicular to second metal layer 430 and substantially in parallel with first metal layer 410. A source metal bar 455 overlays both source metal bars 435 and drain metal bars 440 and is electrically connected to source metal bars 435 by vias 425A. A drain metal bar 460 overlays both source metal bars 435 and drain metal bars 440 and is electrically connected to drain metal bars 445 by vias 425B. A width of metal bars 455 and 460 may be greater than a width of metal bars 435 and 440.

Figure 5D:
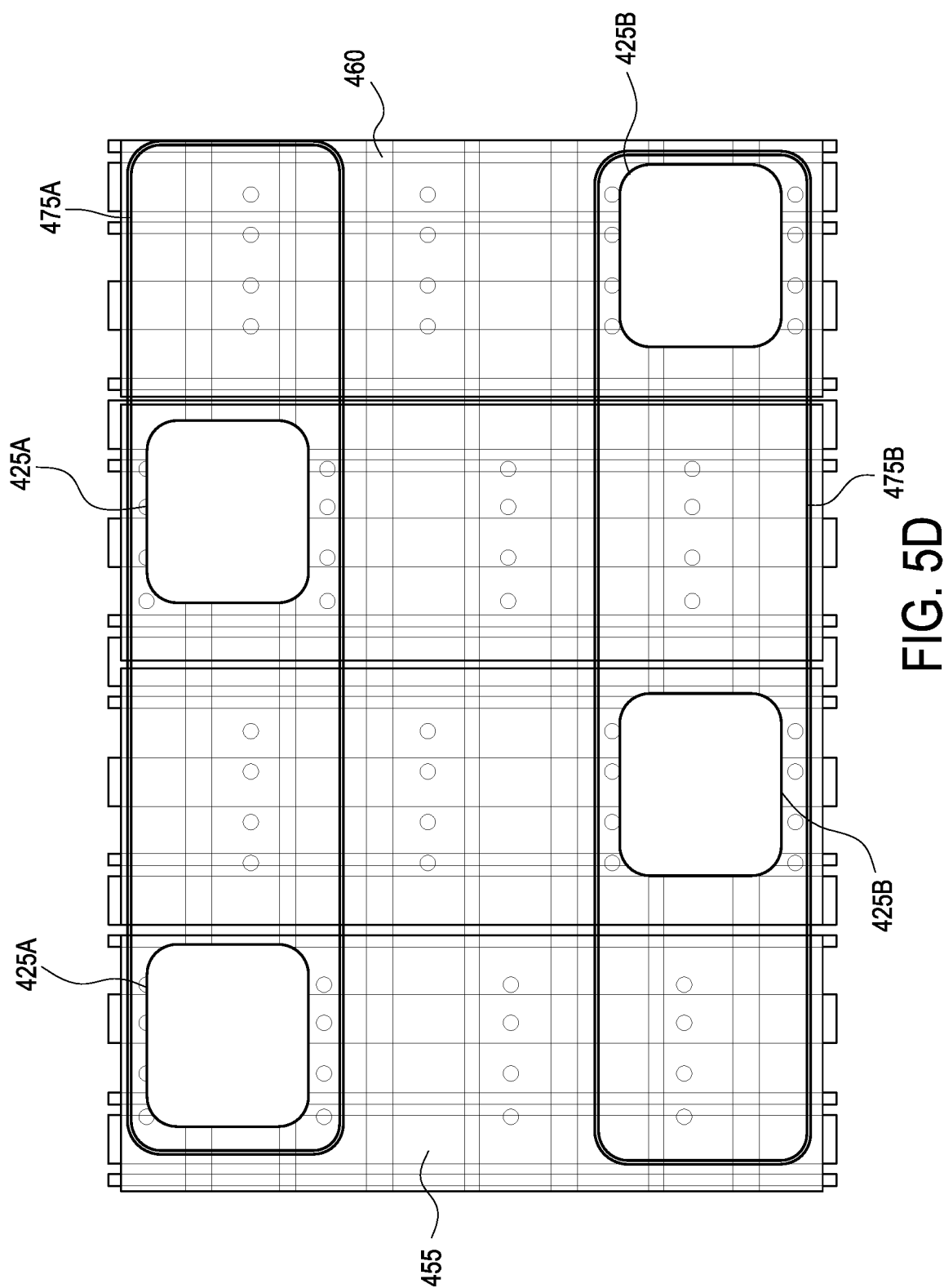

FIG. 5D illustrates a top plan view of solder bumps 475 overlaid substantially perpendicular to third metal layer 450 and first metal layer 410, and substantially in parallel with second metal layer 430. Solder bump 475A directly touches source metal bars 455 through openings 520 in nonconductive layer 470 and electrically connects two or more source metal bars 455. Solder bump 475B directly touches drain metal bars 460 through openings 525 in nonconductive layer 470 and electrically connects two or more drain metal bars 460.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A lateral power semiconductor device, comprising:
   one or more gate electrodes;
   a first metal layer comprising a plurality of first source bars and a plurality of first drain bars interleaved with the one or more gate electrodes;
   a second metal layer separated from the first metal layer by a dielectric and comprising a plurality of second source bars and a plurality of second drain bars, wherein the first and the second source bars are electrically connected, and wherein the first and the second drain bars are electrically connected;
   a third metal layer separated from the second metal layer by the dielectric and comprising a plurality of third source bars and a plurality of third drain bars, wherein the second and the third source bars are electrically connected, and wherein the second and the third drain bars are electrically connected;
   a first solder bump electrically connected to the third source bars; and
   a second solder bump electrically connected to the third drain bars;
   wherein the plurality of first, second and third source bars and drain bars in the first, the second, and the third metal layers, and the electrical connections therebetween, create a plurality of electrical paths for current to flow through the lateral power semiconductor device, such that current flows through the electrical path having a minimum of resistance, thereby reducing the on-resistance of the lateral power semiconductor device;
   wherein the third source bars comprise wider sections and narrower sections, wherein the third drain bars comprise wider sections and narrower sections, wherein the wider sections of the third source bars are interleaved with the narrower sections of the third drain bars, wherein the narrower sections of the third source bars are interleaved with the wider sections of the third drain bars; and
   wherein the first solder bump is electrically connected to the wider sections of the third source bars, and wherein the second solder bump is electrically connected to the wider sections of the third drain bars.

2. The lateral power semiconductor device of claim 1, wherein the first and the third metal layers are substantially parallel to each other, and wherein the second metal layer is substantially perpendicular to the first and the third metal layers.

3. A lateral power semiconductor device, comprising:
   one or more gate electrodes;
   a first metal layer comprising a plurality of first source bars and a plurality of first drain bars interleaved with the one or more gate electrodes;
   a second metal layer separated from the first metal layer by a dielectric and comprising a plurality of second source bars and a plurality of second drain bars, wherein the first and the second source bars are electrically connected, and wherein the first and the second drain bars are electrically connected;

a third metal layer separated from the second metal layer by the dielectric and comprising a plurality of third source bars and a plurality of third drain bars, wherein the second and the third source bars are electrically connected, and wherein the second and the third drain bars are electrically connected;

a first solder bump electrically connected to the third source bars;

a second solder bump electrically connected to the third drain bars; and a nonconductive layer between the third metal layer and the first and the second solder bumps, wherein the nonconductive layer isolates the first solder bump from the third drain bars, and isolates the second solder bump from the third source bars;

wherein the plurality of first, second and third source bars and drain bars in the first, the second, and the third metal layers, and the electrical connections therebetween, create a plurality of electrical paths for current to flow, such that current flows through the electrical path having a minimum of resistance, thereby reducing the on-resistance of the lateral power semiconductor device; and wherein the first and the second metal layers are substantially parallel to each other, and wherein the third metal layer is substantially perpendicular to the first and the second metal layers.

4. The lateral power semiconductor device of claim 3, wherein a width of the first and the second source bars is less than a width of the third source bars, and wherein a width of the first and the second drain bars is less than a width of the third drain bars.

5. The lateral power semiconductor device of claim 3, wherein the third source bars comprise wider sections and narrower sections, wherein the third drain bars comprise wider sections and narrower sections, wherein the wider sections of the third source bars are interleaved with the narrower sections of the third drain bars, wherein the narrower sections of the third source bars are interleaved with the wider sections of the third drain bars.

6. The lateral power semiconductor device of claim 1, wherein the third source bars and the third drain bars are a threshold distance apart.

7. The lateral power semiconductor device of claim 6, wherein the threshold distance apart is two micrometers.

8. The lateral power semiconductor device of claim 1, further comprising a nonconductive layer between the third metal layer and the first and the second solder bumps, wherein the nonconductive layer isolates the first solder bump from the third drain bars and isolates the second solder bump from the third source bars.

9. The lateral power semiconductor device of claim 1, wherein the first and the second solder bumps are comprised of under bump metal.

* * * * *